United States Patent
Ohara

(10) Patent No.: US 7,544,598 B2
(45) Date of Patent: Jun. 9, 2009

(54) SEMICONDUCTOR DEVICE AND METHOD OF MANUFACTURING THE SAME

(75) Inventor: Hiroshi Ohara, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 207 days.

(21) Appl. No.: 11/480,376

(22) Filed: Jul. 5, 2006

(65) Prior Publication Data

US 2007/0018306 A1    Jan. 25, 2007

(30) Foreign Application Priority Data

Jul. 19, 2005   (JP) ............................. 2005-208667

(51) Int. Cl.
*H01L 21/28* (2006.01)
*H01L 21/44* (2006.01)

(52) U.S. Cl. .................. 438/612; 438/666; 257/737; 257/E23.021

(58) Field of Classification Search ............. 438/666, 438/612; 257/773, 786, E23.021
See application file for complete search history.

(56) References Cited

U.S. PATENT DOCUMENTS

| | | | |
|---|---|---|---|
| 5,716,218 A | * | 2/1998 | Farnworth et al. ............. 438/15 |
| 5,844,317 A | * | 12/1998 | Bertolet et al. ............... 257/773 |
| 7,122,896 B2 | | 10/2006 | Saito et al. |
| 7,231,712 B2 | | 6/2007 | Saito et al. |
| 7,408,260 B2 | * | 8/2008 | Fjelstad et al. ............... 257/734 |
| 2001/0007375 A1 | * | 7/2001 | Fjelstad et al. ............... 257/773 |
| 2002/0076908 A1 | * | 6/2002 | Makino et al. ............... 438/612 |
| 2005/0200029 A1 | * | 9/2005 | Hashimoto .................. 257/781 |

FOREIGN PATENT DOCUMENTS

| | | |
|---|---|---|
| CN | 1584672 A | 2/2005 |
| CN | 1604721 A | 4/2005 |
| JP | A 02-272737 | 11/1990 |

* cited by examiner

*Primary Examiner*—Nitin Parekh
(74) *Attorney, Agent, or Firm*—Oliff & Berridge, PLC

(57) ABSTRACT

A method of manufacturing a semiconductor device, including: providing a semiconductor substrate which has a plurality of electrodes and in which a depression is formed on a side on which the electrodes are formed; forming a resin protrusion on the semiconductor substrate so that part of the resin protrusion is positioned in the depression; and forming an interconnect on the resin protrusion, the interconnect being electrically connected to at least one of the electrodes.

11 Claims, 4 Drawing Sheets

SEMICONDUCTOR DEVICE AND METHOD OF MANUFACTURING THE SAME

Japanese Patent Application No. 2005-208667, filed on Jul. 19, 2005, is hereby incorporated by reference in its entirety.

BACKGROUND OF THE INVENTION

The present invention relates to a semiconductor device and a method of manufacturing the same.

In order to reduce the size of electronic parts, it is desirable that a semiconductor device have a small external shape. However, along with diversification of the functions of semiconductor devices, the degree of integration of an integrated circuit formed on a semiconductor chip has been increased, and the number of pins of the semiconductor chip has been increased. Therefore, a semiconductor device has been demanded which can achieve a reduction in size of the semiconductor device and an increase in degree of integration of the integrated circuit.

As a semiconductor device which can satisfy such a demand, a semiconductor device in which an interconnect is formed on a semiconductor chip has attracted attention (see JP-A-2-272737). This semiconductor device can be reduced in size since the external shape of the semiconductor device can be made approximately equal to the external shape of the semiconductor chip.

This semiconductor device is also required to exhibit high reliability. In addition, a method of efficiently manufacturing this semiconductor device while ensuring reliability has been demanded.

SUMMARY

According to a first aspect of the invention, there is provided a method of manufacturing a semiconductor device, comprising:
providing a semiconductor substrate which includes a plurality of electrodes and in which a depression is formed on a side on which the electrodes are formed;
forming a resin protrusion on the semiconductor substrate so that part of the resin protrusion is positioned in the depression; and
forming an interconnect on the resin protrusion, the interconnect being electrically connected to at least one of the electrodes.

According to a second aspect of the invention, there is provided a semiconductor device, comprising:
a semiconductor substrate which includes a plurality of electrodes and in which a depression is formed on a side on which the electrodes are formed;
a resin protrusion formed on the semiconductor substrate so that part of the resin protrusion is positioned in the depression; and
an interconnect formed on the resin protrusion and electrically connected to at least one of the electrodes.

DETAILED DESCRIPTION OF THE EMBODIMENT

Figure 1A:
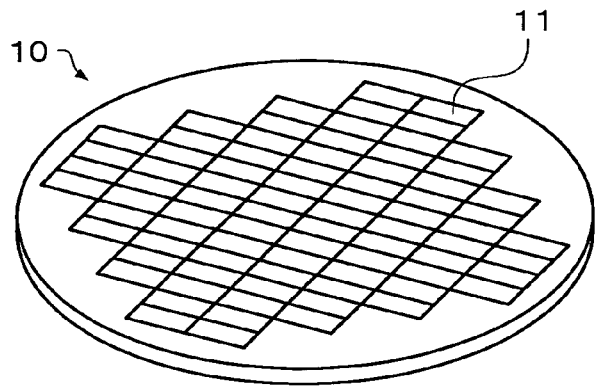
FIGS. 1A to 1D are views illustrative of a method of manufacturing a semiconductor device according to one embodiment of the invention.

The invention may provide a highly reliable semiconductor device and a method of manufacturing the same.

(1) According to one embodiment of the invention, there is provided a method of manufacturing a semiconductor device, comprising:
providing a semiconductor substrate which includes a plurality of electrodes and in which a depression is formed on a side on which the electrodes are formed;
forming a resin protrusion on the semiconductor substrate so that part of the resin protrusion is positioned in the depression; and
forming an interconnect on the resin protrusion, the interconnect being electrically connected to at least one of the electrodes.

According to this embodiment, a resin protrusion which is rarely dislocated or separated can be formed. Therefore, a highly reliable semiconductor device can be manufactured.

(2) In this method of manufacturing a semiconductor device, the resin protrusion may be formed to include a narrow portion which covers the depression.

(3) In this method of manufacturing a semiconductor device,
the resin protrusion may be formed so that the narrow portion has a width which is equal to a width of the depression.

(4) In this method of manufacturing a semiconductor device,
the interconnect may be formed to avoid covering the depression.

(5) In this method of manufacturing a semiconductor device,
a plurality of the interconnects may be disposed so that the depression is positioned between two of the interconnects adjacent to each other.

(6) In this method of manufacturing a semiconductor device,
a plurality of the interconnects may be formed to extend over the same resin protrusion so that part of the resin protrusion covering the depression is disposed between two of the interconnects adjacent to each other.

(7) In this method of manufacturing a semiconductor device, the step of forming the resin protrusion may include:
providing a resin material on the semiconductor substrate so that part of the resin material is positioned in the depression; and
curing the resin material.

(8) According to one embodiment of the invention, there is provided a semiconductor device, comprising:
a semiconductor substrate which includes a plurality of electrodes and in which a depression is formed on a side on which the electrodes are formed;
a resin protrusion formed on the semiconductor substrate so that part of the resin protrusion is positioned in the depression; and an interconnect formed on the resin protrusion and electrically connected to at least one of the electrodes.

According to this embodiment, a highly reliable semiconductor device can be provided in which the resin protrusion is rarely dislocated or separated.

(9) The semiconductor device may further comprise a plurality of the interconnects, wherein the depression is positioned between two of the interconnects adjacent to each other.

(10) In this semiconductor device, the resin protrusion may include a narrow portion which covers the depression;

a plurality of the interconnects may be formed on the same resin protrusion; and the narrow portion of the resin protrusion may be disposed between two of the interconnects adjacent to each other.

Some embodiments of the invention will be described below, with reference to the drawings. Note that the invention is not limited to the embodiments. FIGS. 1A to 5 are views illustrative of a method of manufacturing a semiconductor device according to the embodiments of the invention.

Figure 1B:
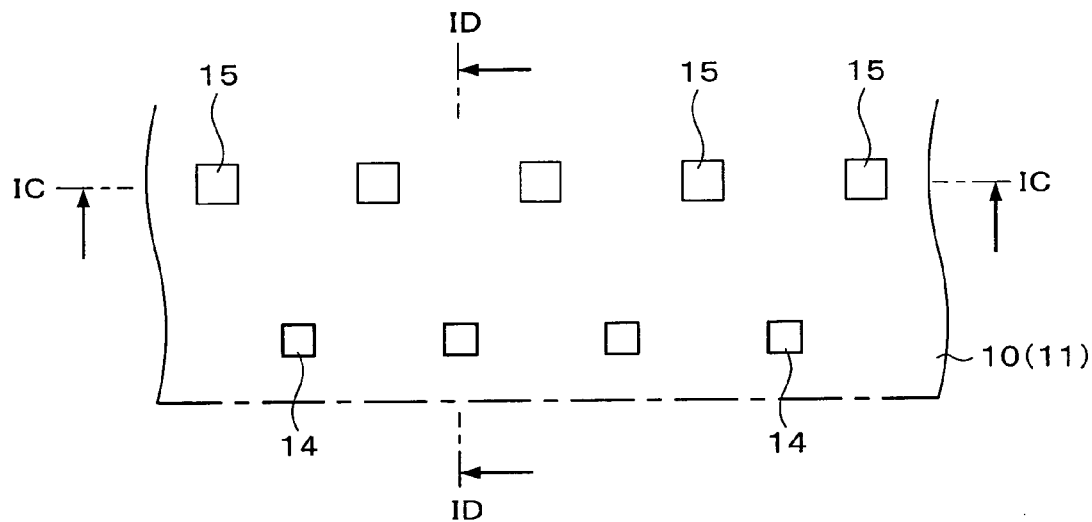
Figure 1C:
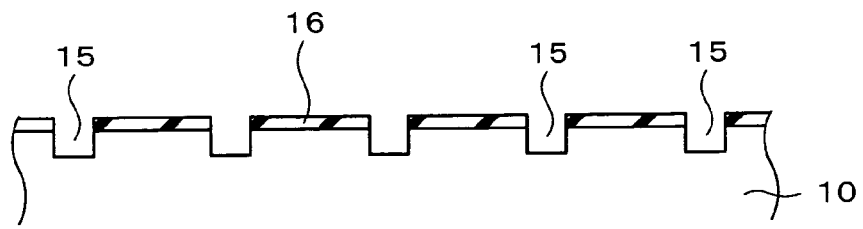
Figure 1D:
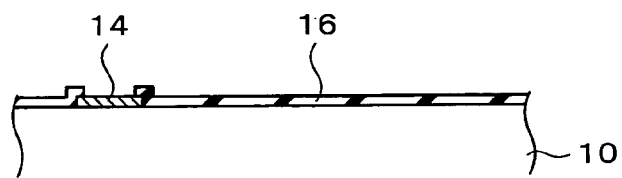

The method of manufacturing a semiconductor device according to one embodiment of the invention includes providing a semiconductor substrate 10. FIGS. 1A to 1D are views illustrative of the semiconductor substrate 10. FIG. 1A is a schematic view of the semiconductor substrate 10, and FIG. 1B is an enlarged top view of part of the semiconductor substrate 10. FIG. 1C is a cross-sectional view along the line IC-IC shown in FIG. 1B, and FIG. 1D is a cross-sectional view along the line ID-ID shown in FIG. 1B.

The semiconductor substrate 10 may be a silicon substrate or the like. The semiconductor substrate 10 may be in the shape of a wafer (see FIG. 1A). The semiconductor substrate 10 in the shape of a wafer may include areas 11 in which semiconductor devices are respectively formed. Note that the semiconductor substrate 10 may be in the shape of a chip (see FIG. 5). One or more integrated circuits may be formed on the semiconductor substrate 10 (one integrated circuit may be formed on a semiconductor chip, and two or more integrated circuits may be formed on a semiconductor wafer) (not shown). The configuration of the integrated circuit is not particularly limited. For example, the integrated circuit may include an active element such as a transistor and a passive element such as a resistor, coil, or capacitor.

As shown in FIGS. 1B and 1C, the semiconductor substrate 10 includes an electrode 14. The electrode 14 may be electrically connected with the inside of the semiconductor substrate 10. The electrode 14 may be electrically connected with the integrated circuit. A conductor which is not electrically connected with the integrated circuit may also be called the electrode 14. The electrode 14 may be part of an internal interconnect of the semiconductor substrate. The electrode 14 may be a portion of the internal interconnect of the semiconductor substrate used for electrical connection with the outside. The electrode 14 may be formed of a metal such as aluminum or copper.

As shown in FIGS. 1C and 1D, the semiconductor substrate 10 may include a passivation film 16. The passivation film 16 may be formed to expose the electrode 14. The passivation film 16 may have an opening which exposes the electrode 14. The passivation film 16 may be formed to partially cover the electrode 14. The passivation film 16 may be formed to cover the outer portion of the electrode 14. The passivation film may be an inorganic insulating film formed of $SiO_2$, SiN, or the like. The passivation film 16 may be an organic insulating film formed of a polyimide resin or the like.

The semiconductor substrate 10 may include an oxide film (not shown). The oxide film may be formed on the electrode 14 in the area covering the opening in the passivation film 16. The oxide film may be formed inside the opening in the passivation film 16.

As shown in FIGS. 1B and 1C, a depression 15 is formed in the semiconductor substrate 10. The depression 15 is formed in the semiconductor substrate 10 on the side on which the electrode 14 is formed. The shape of the depression 15 is not particularly limited. The depression 15 may be formed through the passivation film 16 to reach the integrated circuit layer of the semiconductor substrate 10. In this case, the depression 15 may be formed in the area in which the integrated circuit is not formed. Or, the depression 15 may be formed to not reach the integrated circuit layer of the semiconductor substrate 10 (not shown). In this case, the depression 15 may be formed to not pass through the passivation film 16. The depression 15 is disposed in the area for forming a resin protrusion 20. This allows the resin protrusion 20 to be formed so that part of the resin protrusion 20 is positioned in the depression 15. A plurality of depressions 15 may be formed in the area for forming one resin protrusion 20. For example, the depressions 15 may be arranged along the direction in which the area for forming the resin protrusion 20 extends.

Figure 3A:
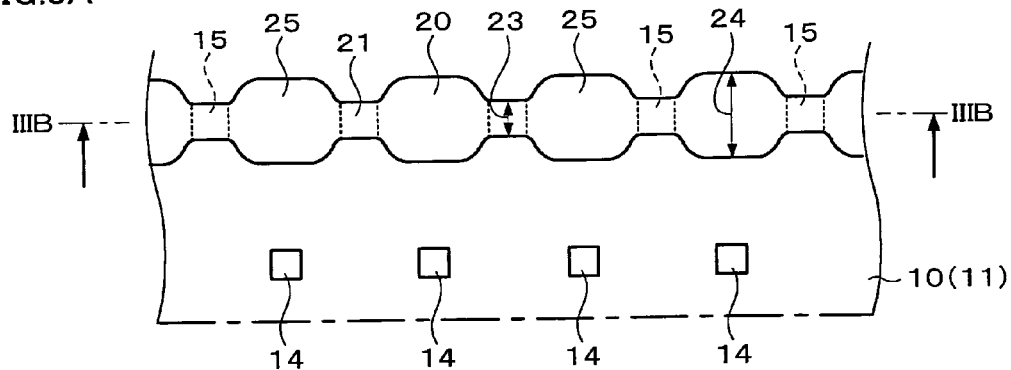
FIGS. 3A and 3B are views illustrative of a method of manufacturing a semiconductor device according to one embodiment of the invention.
Figure 3B:
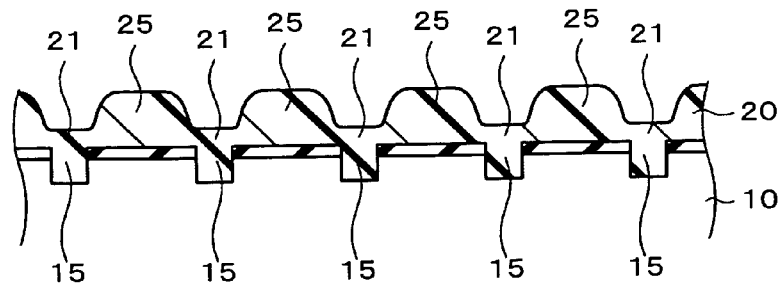

The method of manufacturing a semiconductor device according to one embodiment of the invention includes forming the resin protrusion 20 on the semiconductor substrate 10 (see FIGS. 3A and 3B). The resin protrusion 20 is formed so that part of the resin protrusion 20 is positioned in the depression 15. The resin protrusion 20 may be formed of a known material. For example, the resin protrusion 20 may be formed of a resin such as a polyimide resin, silicone-modified polyimide resin, epoxy resin, silicone-modified epoxy resin, phenol resin, benzocyclobutene (BCB), or polybenzoxazole (PBO).

Figure 2A:
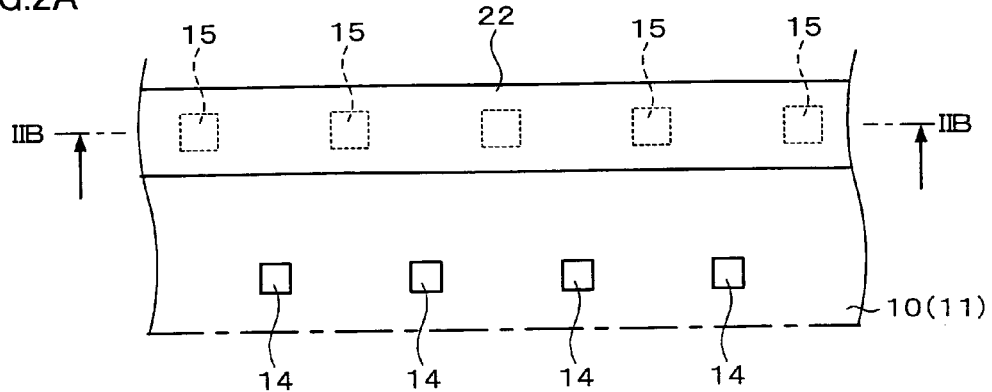
FIGS. 2A and 2B are views illustrative of a method of manufacturing a semiconductor device according to one embodiment of the invention.
Figure 2B:
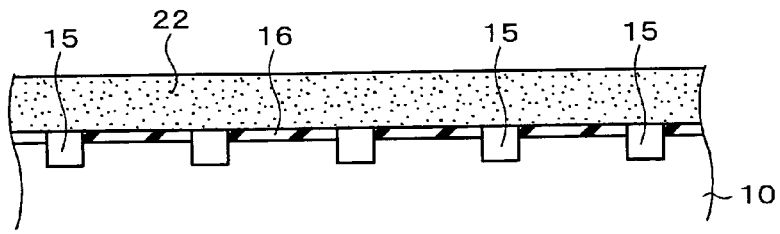

The method of forming the resin protrusion 20 is not particularly limited. An example of the method of forming the resin protrusion 20 is described below with reference to FIGS. 2A to 3B. As shown in FIGS. 2A and 2B, a resin material 22 is provided on the semiconductor substrate 10 (passivation film 16). The resin material 22 may be patterned. The resin material 22 may be provided in the area for forming the resin protrusion 20. The resin material 22 may be provided over the entire surface of the semiconductor substrate 10, and part of the resin material 22 may be then removed, for example. In this case, the resin material 22 may be provided to cover the depression 15. As shown in FIG. 2B, the resin material 22 may be provided so that the resin material 22 is not positioned in the depression 15. The resin material 22 may be then caused to flow by melting the resin material 22. The resin material 22 may be caused to flow so that part of the resin material 22 is positioned in the depression 15. The resin material 21 may be then cured (e.g. thermally cured) to form the resin protrusion 20 shown in FIGS. 3A and 3B. The amount of resin material provided on the surface of the semiconductor substrate 10 in the area covering the depression 15 can be reduced without patterning the resin material into a complicated shape by providing the resin material 22 to be not positioned in the depression 15 (see FIG. 2B) and melting the resin material 22 so that part of the resin material 22 is positioned in the depression 15. The resin material 22 may be cured so that the resin protrusion 20 includes a narrow portion 21 (described later).

The shape of the resin protrusion 20 is not particularly limited. As shown in FIGS. 3A and 3B, the resin protrusion 20 may be formed to include the narrow portion 21 which covers the depression 15, for example. As shown in FIG. 3A, the narrow portion 21 may have a width 23 smaller than a width 24 of another portion (protrusion 25) of the resin protrusion 20. As shown in FIG. 3A, the narrow portion 21 may have the same width as that of the depression 15. The width of the resin protrusion 20, the width of the narrow portion 21, and the width of the depression 15 may refer to the dimensions in the direction perpendicular to the direction in which the resin protrusion 20 extends. In more detail, the width of the resin protrusion 20, the width of the narrow portion 21, and the width of the depression 15 may refer to the dimensions of the resin protrusion 20, the narrow portion 21, and the depression 15 in the direction perpendicular to the direction in which the resin protrusion 20 extends in a plan view of the side of the semiconductor substrate 10 on which the electrode 14 is formed. As shown in FIG. 3B, the narrow portion 21 may have a height smaller than the height of the other portion (protrusion 25) of the resin protrusion 20. The portion of the resin protrusion 20 having a height greater than that of the narrow portion 21 may be called a protrusion 25 of the resin protrusion 20. Specifically, the resin protrusion 20 may include the narrow portion 21 and the protrusion 25. In this case, the resin protrusion 20 may have a shape in which the narrow portions 21 and the protrusions 25 are alternately arranged. The surface of the resin protrusion 20 may be curved. In this case, the cross-sectional shape of the resin protrusion 20 may be a semicircle. Note that the resin protrusion 20 may have a hemispherical shape (not shown). The resin protrusion 20 may be formed in the area in which the electrode 14 is not formed.

Figure 4A:
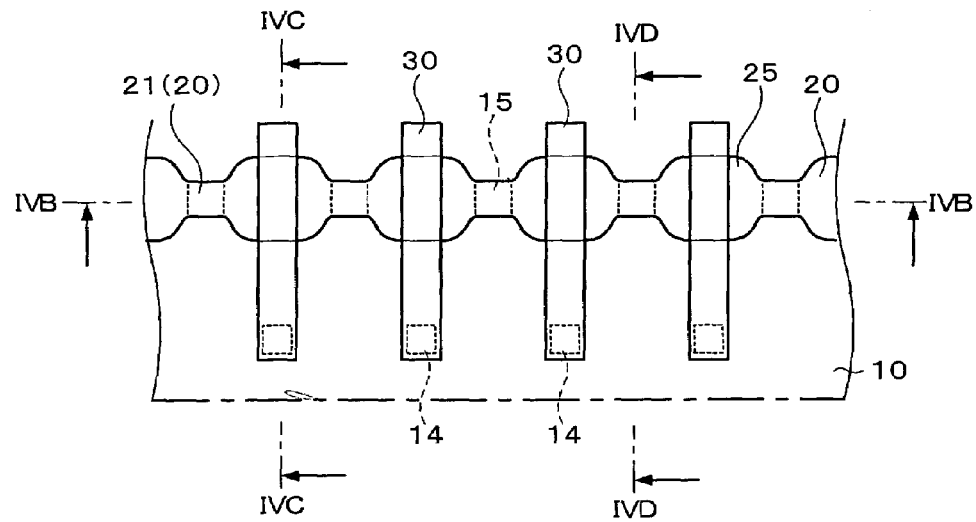
FIGS. 4A to 4D are views illustrative of a method of manufacturing a semiconductor device according to one embodiment of the invention.
Figure 4B:
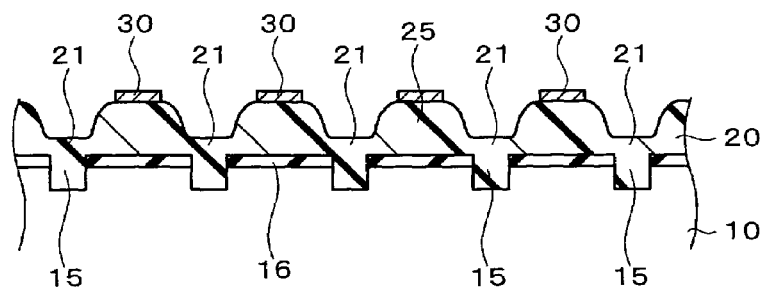
Figure 4C:
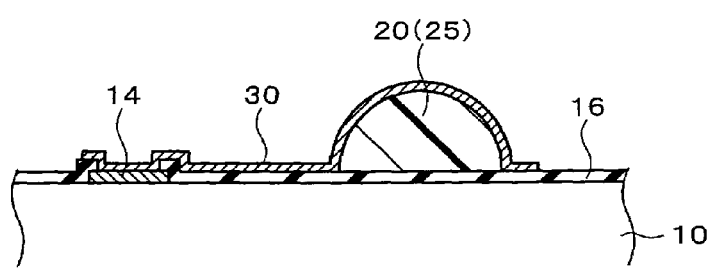
Figure 4D:
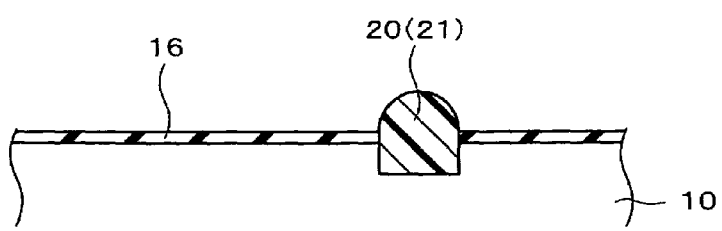

The method of manufacturing a semiconductor device according to one embodiment of the invention includes forming an interconnect 30 on the resin protrusion 20, the interconnect 30 being electrically connected to the electrode 14, as shown in FIGS. 4A to 4D. FIG. 4A is a view illustrative of the state in which the interconnect 30 is formed. FIGS. 4B to 4D are cross-sectional views along the line IVB-IVB, the line IVC-IVC, and the line IVD-IVD shown in FIG. 4A, respectively. The interconnect 30 is formed on the resin protrusion 20 (to extend over the resin protrusion 20). As shown in FIGS. 4A to 4C, the interconnect 30 may be formed to avoid covering the depression 15. The interconnects 30 may be formed so that the depression 15 is disposed between two adjacent interconnects 30. In other words, the interconnects 30 may be formed so that two adjacent interconnects 30 are disposed to put the depression 15 therebetween. When the resin protrusion 20 includes the narrow portion 21, the interconnect 30 may be formed to avoid the narrow portion 21. In this case, the interconnect 30 may be formed to extend between two narrow portions 21. Specifically, the interconnects 30 may be formed so that the narrow portion 21 is disposed between two adjacent interconnects 30. In other words, the interconnects 30 may be formed so that the interconnects 30 extend over one resin protrusion 20 and part of the resin protrusion 20 covering the depression 15 is disposed between two adjacent interconnects 30. Specifically, the interconnect 30 may be formed to extend over the protrusion 25. This allows the length of the surface of the resin protrusion 20 to be increased between two adjacent interconnects 30. Therefore, a highly reliable semiconductor device can be manufactured in which an electrical short circuit due to migration rarely occurs between two adjacent interconnects 30.

The method of forming the interconnect 30 is not particularly limited. For example, the interconnect 30 may be formed by providing metal foil by sputtering and then patterning the metal foil. Likewise, the structure of the interconnect 30 is not particularly limited. For example, the interconnect 30 may be formed of a plurality of layers. In this case, the interconnect 30 may include a first layer formed of titanium tungsten and a second layer formed of gold (not shown). Or, -the interconnect 30 may be formed of a single layer. The interconnect 30 may be formed to contact the passivation film 16. In this case, the interconnect 30 may be formed to contact the passivation film 16 on both sides of the resin protrusion 20. The interconnect 30 may be formed to contact the electrode 14. This allows the interconnect 30 to be electrically connected with the electrode 14.

When an oxide film is formed on the surface of the electrode 14, the interconnect 30 may be formed after removing the oxide film. This ensures reliable electrical connection between the electrode 14 and the interconnect 30. The oxide film may be removed by a known method. For example, the oxide film may be removed by a method utilizing Ar gas.

Figure 5:
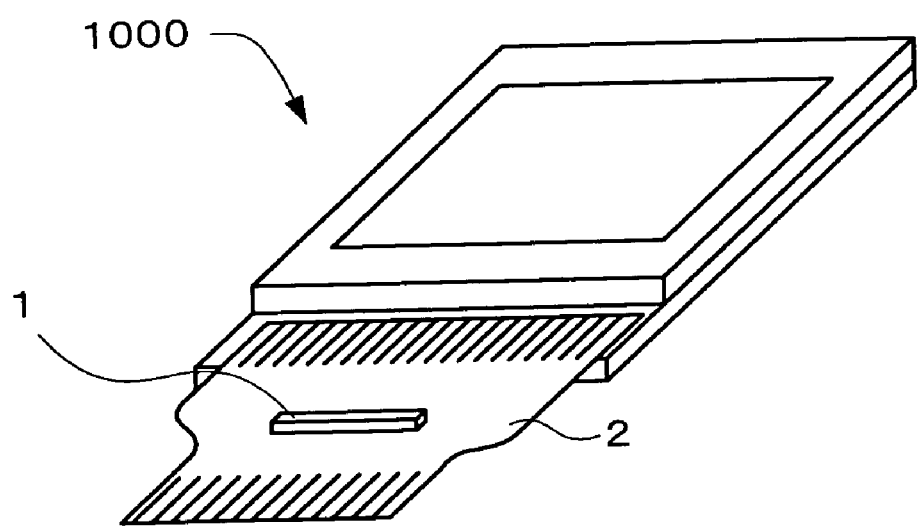
FIG. 5 is a view showing an electronic module on which a semiconductor device according to one embodiment of the invention is mounted.

A step of cutting the semiconductor substrate 10 into individual pieces, an inspection step, and the like may be then performed to obtain a semiconductor device 1 (see FIG. 5).

According to this method, the resin protrusion 20 can be formed so that part of the resin protrusion 20 is positioned in the depression 15. This allows formation of the resin protrusion 20 having a large contact area with the semiconductor substrate 10. Therefore, this method allows manufacture of a highly reliable semiconductor device including the resin protrusion 20 which is rarely dislocated or separated. Moreover, this method allows the resin protrusion 20 including the narrow portion 21 to be efficiently formed, as described later. Therefore, a highly reliable semiconductor device can be manufactured in which an electrical short circuit rarely occurs between two adjacent interconnects 30. In particular, when the oxide film is removed by utilizing Ar gas, the surface of the resin may be carbonized, whereby the insulation resistance may be decreased. However, since the narrow portion 21 increases the length of the surface of the resin between two adjacent interconnects 30, a highly reliable semiconductor device can be manufactured in which an electrical short circuit rarely occurs between two adjacent interconnects 30.

The semiconductor device 1 according to one embodiment of the invention includes the semiconductor substrate 10. The semiconductor substrate 10 includes the electrode 14. The depression 15 is formed in the semiconductor substrate 10 on the side on which the electrode 14 is formed. The semiconductor device 1 includes the resin protrusion 20 formed on the semiconductor substrate 10 so that part of the resin protrusion 20 is positioned in the depression 15. The resin protrusion 20 may include the narrow portion 21. The semiconductor device 1 includes the interconnect 30. The interconnect 30 is formed to be electrically connected with the electrode 14. The interconnect 30 is formed to extend over the resin protrusion 20. When the resin protrusion 20 includes the narrow portion 21, the interconnect 30 may be formed to avoid the narrow portion 21. The resin protrusion of the semiconductor device according to this embodiment may be formed to not include the narrow portion.

FIG. 5 shows an electronic module 1000 on which the semiconductor device 1 is mounted. In the example shown in FIG. 5, the semiconductor device 1 is mounted on a substrate 2. The substrate 2 may be a rigid substrate (e.g. glass substrate or silicon substrate) or a flexible substrate (e.g. film substrate). The semiconductor device 1 may be mounted so that the side on which the interconnect 30 is formed faces the substrate 2. In this case, an interconnect of the substrate 2 and the interconnect 30 may contact each other and be electrically connected. In more detail, the interconnect of the substrate 2 and the portion of the interconnect 30 covering the top portion of the resin protrusion 20 may contact each other and be electrically connected. This allows the interconnect 30 to be pressed against the interconnect of the substrate 2 due to the elasticity of the resin protrusion 20. Therefore, a semiconductor device with excellent electrical connection reliability can be provided. The semiconductor device 1 may be bonded to the substrate 2 using an adhesive (resin adhesive). The electronic module 1000 may be a display device. The display device may be a liquid crystal display device, an electroluminescent (EL) display device, or the like.

The semiconductor device 1 may be a driver IC which controls the display device.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A method of manufacturing a semiconductor device, comprising:
    providing a semiconductor substrate which includes a plurality of electrodes and an insulating film formed on a first side of the semiconductor substrate, a depression formed on a first surface of the semiconductor substrate, the first surface of the semiconductor substrate being positioned on the first side of the semiconductor substrate;
    forming a resin protrusion on the semiconductor substrate so that a first part of the resin protrusion is positioned in the depression and a second part of the resin protrusion is positioned on the first surface of the semiconductor substrate; and
    forming an interconnect on the second part of the resin protrusion, the interconnect being electrically connected to at least one of the electrodes.

2. The method of manufacturing a semiconductor device as defined in claim 1,
    wherein the resin protrusion is formed to include a narrow portion which covers the depression.

3. The method of manufacturing a semiconductor device as defined in claim 2,
    wherein the resin protrusion is formed so that the narrow portion has a width which is equal to a width of the depression.

4. The method of manufacturing a semiconductor device as defined in claim 2,
    wherein the interconnect is formed to avoid covering the depression.

5. The method of manufacturing a semiconductor device as defined in claim 2,
    wherein a plurality of the interconnects are disposed so that the depression is positioned between two of the interconnects adjacent to each other.

6. The method of manufacturing a semiconductor device as defined in claim 2,
    wherein a plurality of the interconnects are formed to extend over the resin protrusion so that the first part of the resin protrusion is disposed between two of the plurality of the interconnects adjacent to each other in plane view.

7. The method of manufacturing a semiconductor device as defined in claim 2,
    wherein the forming of the resin protrusion includes:
    providing a resin material on the semiconductor substrate so that a first part of the resin material is positioned in the depression; and
    curing the resin material.

8. The method of manufacturing a semiconductor device as defined in claim 1,
    wherein the interconnect is formed to avoid covering the depression.

9. The method of manufacturing a semiconductor device as defined in claim 1,
    wherein a plurality of the interconnects are disposed so that the depression is positioned between two of the interconnects adjacent to each other.

10. The method of manufacturing a semiconductor device as defined in claim 1,
    wherein a plurality of the interconnects are formed to extend over the resin protrusion so that the first part of the resin protrusion is disposed between two of the plurality of the interconnects adjacent to each other in plane view.

11. The method of manufacturing a semiconductor device as defined in claim 1,
    wherein the forming of the resin protrusion includes:
    providing a resin material on the semiconductor substrate so that a first part of the resin material is positioned in the depression; and
    curing the resin material.

* * * * *